United States Patent
Knorr et al.

(10) Patent No.: US 9,000,534 B2
(45) Date of Patent: Apr. 7, 2015

(54) METHOD FOR FORMING AND INTEGRATING METAL GATE TRANSISTORS HAVING SELF-ALIGNED CONTACTS AND RELATED STRUCTURE

(75) Inventors: Andreas H. Knorr, Wappingers Falls, NY (US); Frank Scott Johnson, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/456,462

(22) Filed: Jun. 17, 2009

(65) Prior Publication Data

US 2010/0320509 A1    Dec. 23, 2010

(51) Int. Cl.

| | | |
|---|---|---|
| H01L 29/78 | (2006.01) | |
| H01L 21/768 | (2006.01) | |
| H01L 27/06 | (2006.01) | |
| H01L 49/02 | (2006.01) | |
| H01L 21/28 | (2006.01) | |
| H01L 23/525 | (2006.01) | |
| H01L 29/66 | (2006.01) | |

(52) U.S. Cl.
CPC .......... *H01L 29/78* (2013.01); *H01L 21/76832* (2013.01); *H01L 21/76834* (2013.01); *H01L 21/76897* (2013.01); *H01L 27/0617* (2013.01); *H01L 27/0629* (2013.01); *H01L 28/20* (2013.01); *H01L 29/7843* (2013.01); *H01L 21/28044* (2013.01); *H01L 23/5256* (2013.01); *H01L 29/66575* (2013.01)

(58) Field of Classification Search
CPC ............ H01L 21/768; H01L 21/76829; H01L 21/76897; H01L 27/115; H01L 29/66515; H01L 29/6656
USPC .......... 257/379, 355, E21.179, 380; 438/239, 438/257, 664, 238
See application file for complete search history.

(56) References Cited

U.S. PATENT DOCUMENTS

| | | | |
|---|---|---|---|
| 5,663,586 A * | 9/1997 | Lin ................................ | 257/336 |
| 7,091,087 B2 * | 8/2006 | Hurley .......................... | 438/257 |
| 7,566,651 B2 * | 7/2009 | Wong et al. ................... | 438/621 |
| 7,776,687 B2 * | 8/2010 | Kang et al. .................... | 438/257 |
| 2006/0264057 A1 * | 11/2006 | Manning ....................... | 438/740 |
| 2008/0001191 A1 * | 1/2008 | Pruefer et al. ................ | 257/288 |
| 2008/0160760 A1 * | 7/2008 | Hyun ............................ | 438/675 |
| 2008/0181003 A1 * | 7/2008 | Nguyen et al. ............ | 365/185.12 |
| 2008/0203486 A1 * | 8/2008 | Wiatr et al. ................... | 257/369 |
| 2009/0072293 A1 * | 3/2009 | Nam ............................. | 257/316 |
| 2009/0283840 A1 * | 11/2009 | Coolbaugh et al. ........... | 257/379 |
| 2010/0090321 A1 * | 4/2010 | Mulfinger et al. ............ | 257/632 |
| 2010/0193867 A1 * | 8/2010 | Yan et al. ...................... | 257/355 |

* cited by examiner

*Primary Examiner* — John C Ingham
(74) *Attorney, Agent, or Firm* — Farjami & Farjami LLP (57) ABSTRACT

According to one exemplary embodiment, a method for forming at least one metal gate transistor with a self-aligned source/drain contact includes forming a metal gate over a substrate. The method further includes forming a source/drain region in the substrate adjacent to the metal gate. The method also includes forming a conformal etch stop layer over the metal gate and the source/drain region. The method further includes forming a source/drain contact over the source/drain region, where the conformal etch stop layer imposes a pre-determined distance between the source/drain contact and the metal gate, thereby causing the source/drain contact to be self-aligned to the metal gate.

19 Claims, 7 Drawing Sheets

Fig. 2F

METHOD FOR FORMING AND INTEGRATING METAL GATE TRANSISTORS HAVING SELF-ALIGNED CONTACTS AND RELATED STRUCTURE

TECHNICAL FIELD

The present invention is generally in the field of semiconductors. More particularly, the invention is in the field of semiconductor device fabrication.

BACKGROUND ART

Field effect transistors (FETs) that are utilized in semiconductor dies including logic circuits, such as high performance logic circuits, typically require low gate resistance, which can be achieved by utilizing silicided polysilicon gates or metal gates. For logic circuits, it is desirable to integrate FETs with polysilicon devices, such as polysilicon resistors and fuses, on a common substrate. However, the integration of metal gates with polysilicon resistors and fuses on a common substrate in a conventional process flow can require a number of additional masking steps, which can undesirably increase fabrication cost.

As a result of continuing advances in technology, the feature size of FETs utilized in logic circuits, such as high performance logic circuits, continues to scale down, which advantageously enables a corresponding reduction in the size of the semiconductor die on which the logic circuit is fabricated. However, as FET feature size is scaled down, separation between gate and source/drain contacts is also decreased. As a result, it can become increasingly difficult to ensure sufficient separation between the gate and source/drain contacts so as to avoid gate-to-source/drain contact shorts.

In a conventional process flow, the source/drain contacts can be aligned to the gates of FETs utilized in logic circuits, such as high performance logic circuits, by aligning a contact mask to a gate pattern. However, as the FETs are scaled down in size, lithographic misalignment tolerance associated with contact mask-to-gate mask alignment can be correspondingly reduced. As a result, the conventional process flow can cause increased gate-to-source/drain contact shorts as FETs are scaled down in size, thereby undesirably reducing manufacturing yield.

SUMMARY

Method for forming and integrating metal transistors having self-aligned contacts and related structure, substantially as shown in and/or described in connection with at least one of the figures, and as set forth more completely in the claims.

DETAILED DESCRIPTION OF THE INVENTION

The present invention is directed to a method for forming and integrating metal gate transistors having self-aligned contacts and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be borne in mind that, unless noted otherwise, like or corresponding elements among the figures may be indicated by like or corresponding reference numerals.

Figure 1:
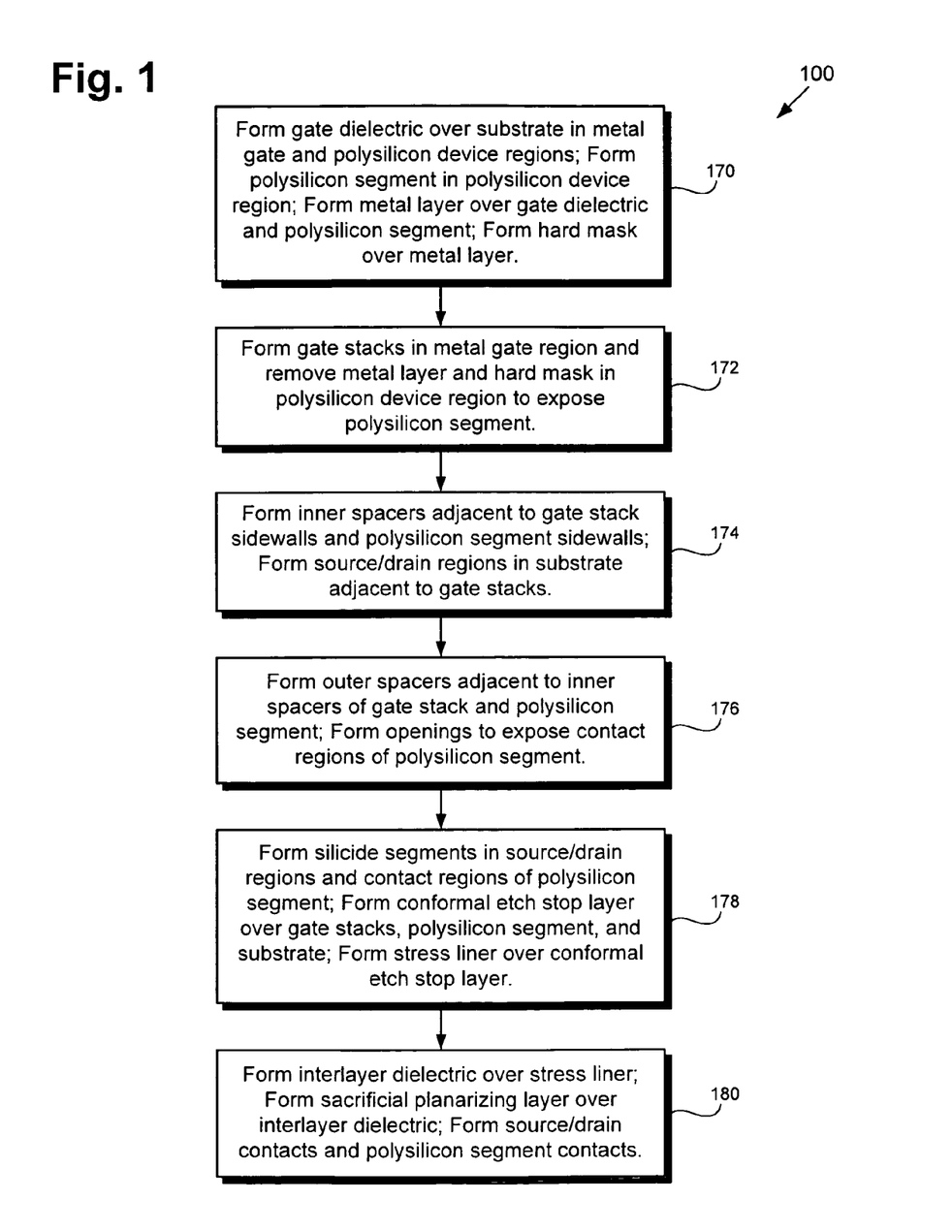
FIG. 1 shows a flowchart illustrating the steps taken to implement an embodiment of the present invention.

FIG. 1 shows a flow chart illustrating an exemplary method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 180 indicated in flowchart 100 are sufficient to describe one embodiment of the present invention; other embodiments of the invention may utilize steps different from those shown in flowchart 100.

It is noted that the processing steps shown in flowchart 100 are performed on a portion of wafer, which, prior to step 170, includes, among other things, a substrate, which includes one or more isolation regions, such as shallow trench isolation (STI) regions. The substrate also includes at least one metal gate device region, which can include one or more metal gate N-channel FETs (NFETs) and/or one or more metal gate P-channel FETs (PFETs). The substrate further includes at least one polysilicon device region, which can include one or more polysilicon devices, such as polysilicon resistors, polysilicon fuses, and/or polysilicon gate transistors. The wafer is also referred to as a semiconductor die or simply a die in the present application.

Moreover, structures 270 through 280 in FIGS. 2A through 2F illustrate the result of performing steps 170 through 180 of flowchart 100, respectively. For example, structure 270 shows a semiconductor structure after processing step 170, structure 272 shows structure 270 after the processing of step 172, structure 274 shows structure 272 after the processing of step 174, and so forth.

Figure 2A:
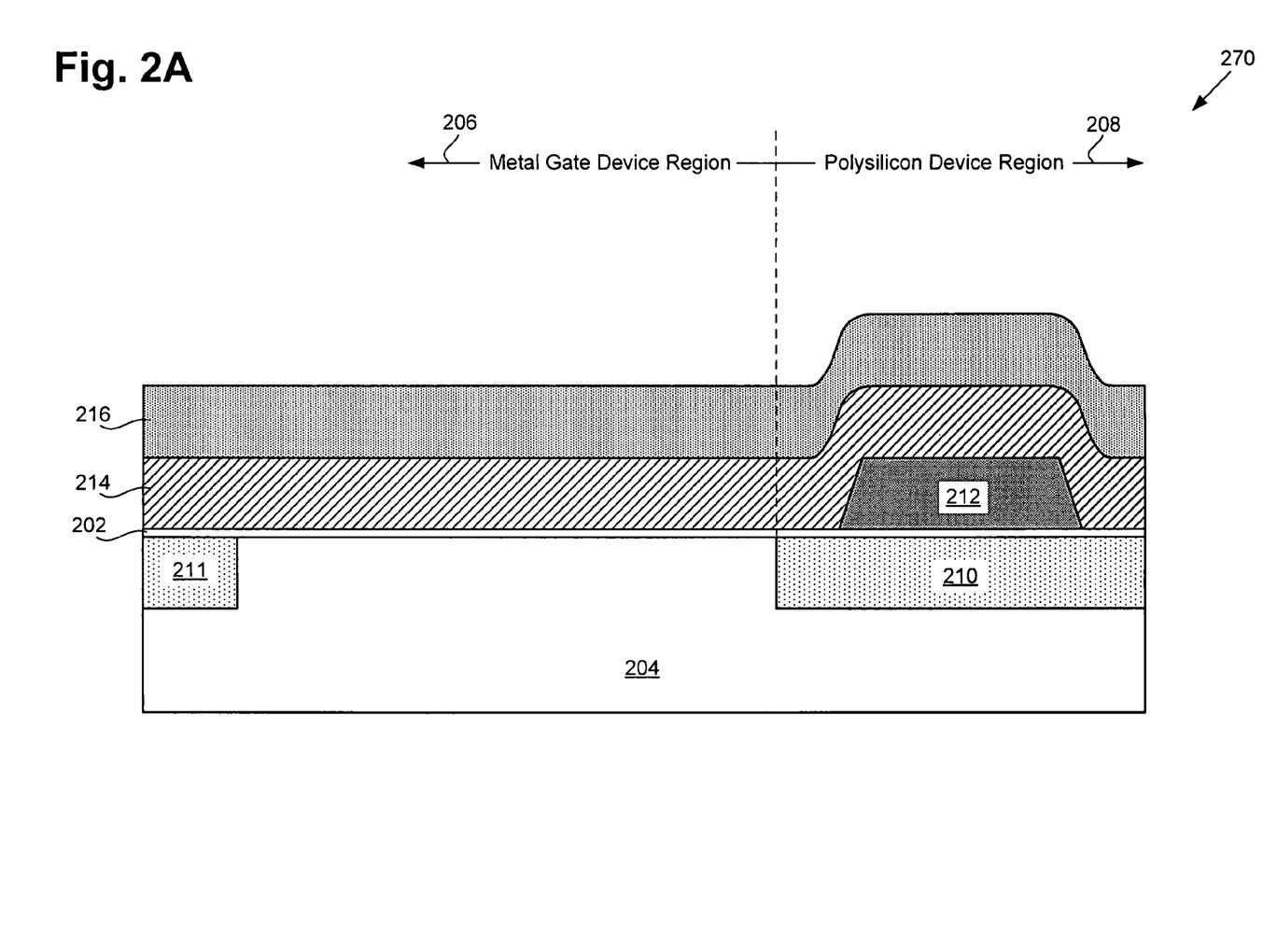
FIG. 2A illustrates a cross-sectional view, which includes a portion of a wafer processed according to an embodiment of the invention, corresponding to an initial step in the flowchart in FIG. 1.

Referring now to step 170 in FIG. 1 and structure 270 in FIG. 2A, at step 170 of flowchart 100, gate dielectric 202 is formed over substrate 204 in metal gate device region 206 and polysilicon device region 208 of substrate 204 and over isolation region 210 in polysilicon device region 208, polysilicon segment 212 is formed over gate dielectric 202 and isolation region 210 in polysilicon device region 208, metal layer 214 is formed over gate dielectric 202 and polysilicon segment 212, and hard mask 216 is formed over metal layer 214. In one embodiment, polysilicon segment 212 can be formed over isolation region 210 in polysilicon device region prior to formation of gate dielectric 202. In that embodiment, gate dielectric 202 can be formed over polysilicon segment 212. In one embodiment, metal layer 214 can be removed from polysilicon device region 208 prior to forming polysilicon segment 212 by utilizing an additional masking step. In that embodiment, polysilicon segment 212 and be formed in polysilicon device region 208 and hard mask 216 can be formed over metal layer 214 in metal gate device region and over polysilicon segment 212 in polysilicon device region 208.

Isolation regions 210 and 211, which can be, for example, STI regions, are situated in substrate 204 in metal gate device region 206 and polysilicon device region 208, respectively. Substrate 204 can be, for example, a bulk silicon substrate. In one embodiment of the present invention, substrate 204 can be a silicon-on-insulator (SOI) substrate. In structure 270, gate dielectric 202 is situated over substrate 204, polysilicon segment 212 is situated over gate dielectric 202 and isolation region 210, metal layer 214 is situated over gate dielectric 202 and polysilicon segment 212, and hard mask 216 is situated over metal layer 214. Gate dielectric 202 can comprise, for example, silicon dioxide, silicon oxynitride, or any high dielectric constant (high-k) metal gate material. Gate dielectric 202 can have an equivalent oxide thickness of, for example, between approximately determined 10.0 Angstroms and approximately 60.0 Angstroms. Gate dielectric 202 can be formed by using a high temperature oxide growth process in an embodiment of the invention. In one embodiment, gate dielectric 202 can be formed by using an atomic layer deposition (ALD) process to deposit a high-k metal gate material. However, gate dielectric 202 can also be formed by a thermal oxidation process, a chemical vapor deposition (CVD) process, or other suitable deposition process.

Polysilicon segment 212 can be a polysilicon device, such as a polysilicon resistor, and has sidewalls 218 and 220, which can be sloped in an embodiment of the invention. In one embodiment, polysilicon segment 212 can be a polysilicon fuse. In another embodiment, polysilicon segment 212 can be a polysilicon gate of a transistor. In one embodiment, sidewalls 218 and 220 of polysilicon segment 212 can be substantially vertical, i.e., substantially perpendicular to the top surface of substrate 204. Polysilicon segment 212 can have a thickness of, for example, between approximately 20.0 nanometers (nm) and approximately 80.0 nm in an embodiment. Polysilicon segment 212 can be formed, for example, by depositing a layer of polysilicon over gate dielectric 202 by using a low pressure chemical vapor deposition (LPCVD) process or other suitable deposition processes and appropriately patterning the polysilicon layer using masking and etch steps. In one embodiment, a blanket ion implantation process can be performed on the layer of polysilicon to determine a desired sheet resistance of the polysilicon prior to patterning the layer. The implantation process can include implanting, for example, phosphorus, boron, or arsenic ions into the polysilicon layer. In one embodiment, polysilicon segment 212 can have N type conductivity. In another embodiment, polysilicon segment 212 can have P type conductivity.

Metal layer 214 can comprise, for example, titanium nitride (TiN), tungsten (W), deposited tungsten silicide (WSi), or other metal having a relatively high melting point, low diffusion and low oxygen susceptibility. Metal layer 214 can have a thickness of, for example, between approximately 20.0 nm and approximately 80.0 nm in one embodiment. Metal layer 214 can be formed over gate dielectric 202 and polysilicon segment 212 by utilizing, for example, a chemical vapor deposition (CVD) process, a physical vapor deposition (PVD) process, or other suitable deposition process.

Hard mask 216 can comprise, for example, a stack of dielectric layers including a thin layer of silicon dioxide and an overlying thick layer of an etch-resistant material, such as silicon nitride. Hard mask 216 can have a thickness of, for example, between approximately 30.0 nm and approximately 50.0 nm in an embodiment. In one embodiment, hard mask 216 can comprise a layer of silicon dioxide having a thickness of between approximately 2.0 and approximately 3.0 nm and a layer of silicon nitride having a thickness of between approximately 40.0 nm and approximately 50.0 nm. In other embodiments, hard mask 216 can comprise a dielectric etch-resistant material other than silicon nitride, such silicon carbide (SiC) or silicon carbon nitride (SiCN). Hard mask 216 can be formed over metal layer 214 by using, for example, a plasma enhanced chemical vapor deposition (PECVD) process, an LPCVD process, or other suitable deposition process. The result of step 170 of flowchart 100 is illustrated by structure 270 in FIG. 2A.

Figure 2B:
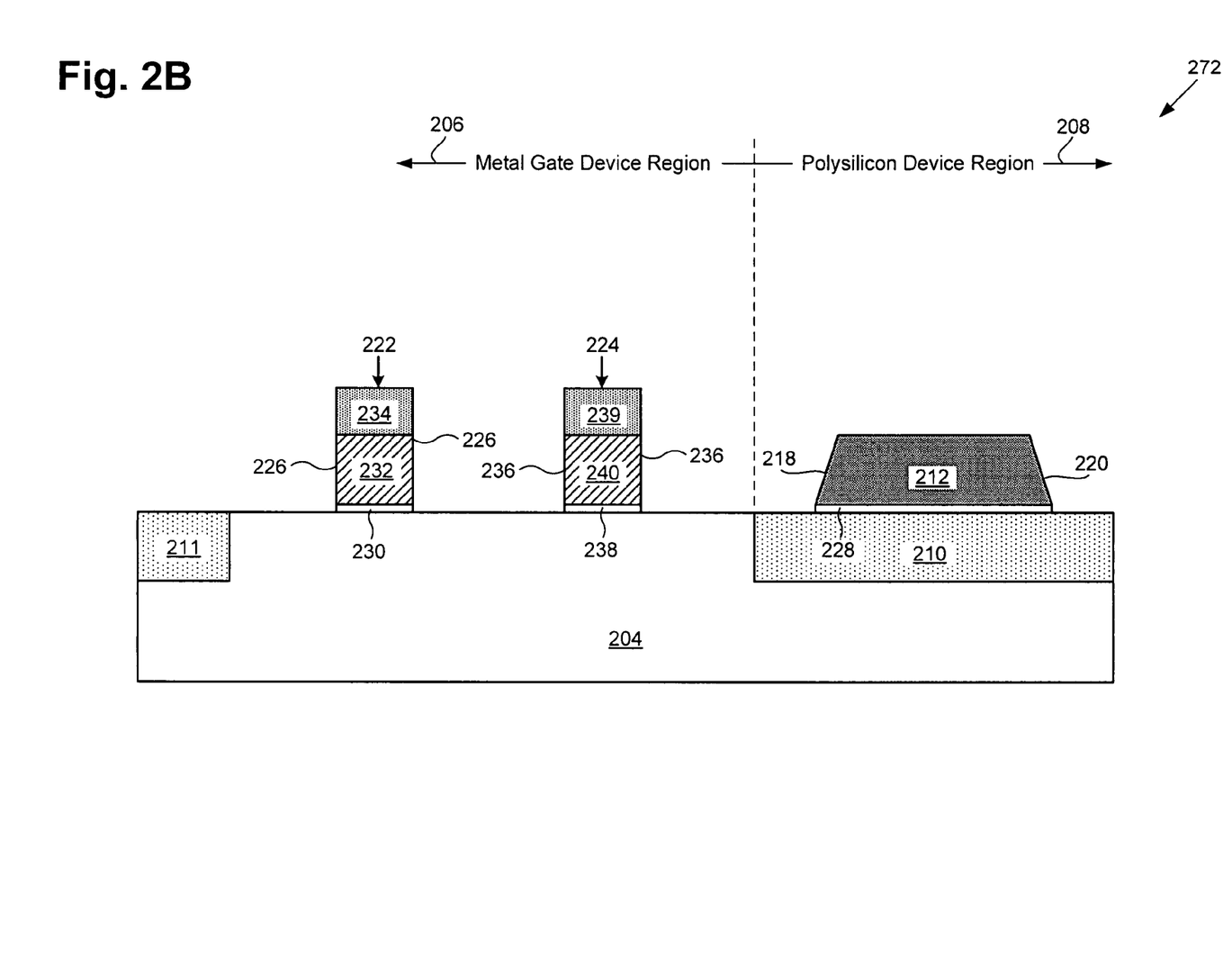
FIG. 2B illustrates a cross-sectional view, which includes a portion of a wafer processed according to an embodiment of the invention, corresponding to an intermediate step in the flowchart in FIG. 1.

Referring to step 172 in FIG. 1 and structure 272 in FIG. 2B, at step 172 of flowchart 100, gate stacks 222 and 224 are formed in metal gate device region 206 and metal layer 214 and hard mask 216 (shown in FIG. 2A) are removed in polysilicon device region 208 to expose polysilicon segment 212. Gate stacks 222 and 224 are situated over substrate 204 and polysilicon segment 212 is situated over gate dielectric segment 228, which is situated over isolation region 210. Gate stack 222 has sidewalls 226 and includes gate dielectric segment 230, metal gate 232, and hard mask segment 234, and gate stack 224 has sidewalls 236 and includes gate dielectric segment 238, metal gate 240, and hard mask segment 239. Gate stacks 222 and 224 can be formed, for example, by depositing and patterning a layer of masking material, such as photoresist, over metal gate device region 206 and using an etch process, such as a reactive ion etch (RIE) process, to remove unprotected portions of metal layer 214 and hard mask 216 (shown in FIG. 2A).

In an embodiment of the invention, metal layer 214 and hard mask 216 (shown in FIG. 2A) can also be removed from polysilicon segment 212 by the same RIE process that is utilized to pattern gate stacks 222 and 224. By removing metal layer 214 and hard mask 216 (from polysilicon segment 212) in the same process step in which gate stacks 222 and 224 are patterned, an additional masking step is not required to remove metal layer 214 and hard mask 216 from polysilicon segment 212. In one embodiment, an additional masking step can be utilized to remove metal layer 214 from polysilicon segment 212. In that embodiment, metal layer 214 can be removed from polysilicon segment 212 prior to forming hard mask 216 by using, for example, an RIE process or a wet etch process. In that embodiment, hard mask 216 can be formed over metal layer 214 in metal gate device region 206 and over polysilicon segment 212 in polysilicon device region 208 and gate stacks 222 and 224 can be patterned as discussed above. The result of step 172 of flowchart 100 is illustrated by structure 272 in FIG. 2B.

Figure 2C:
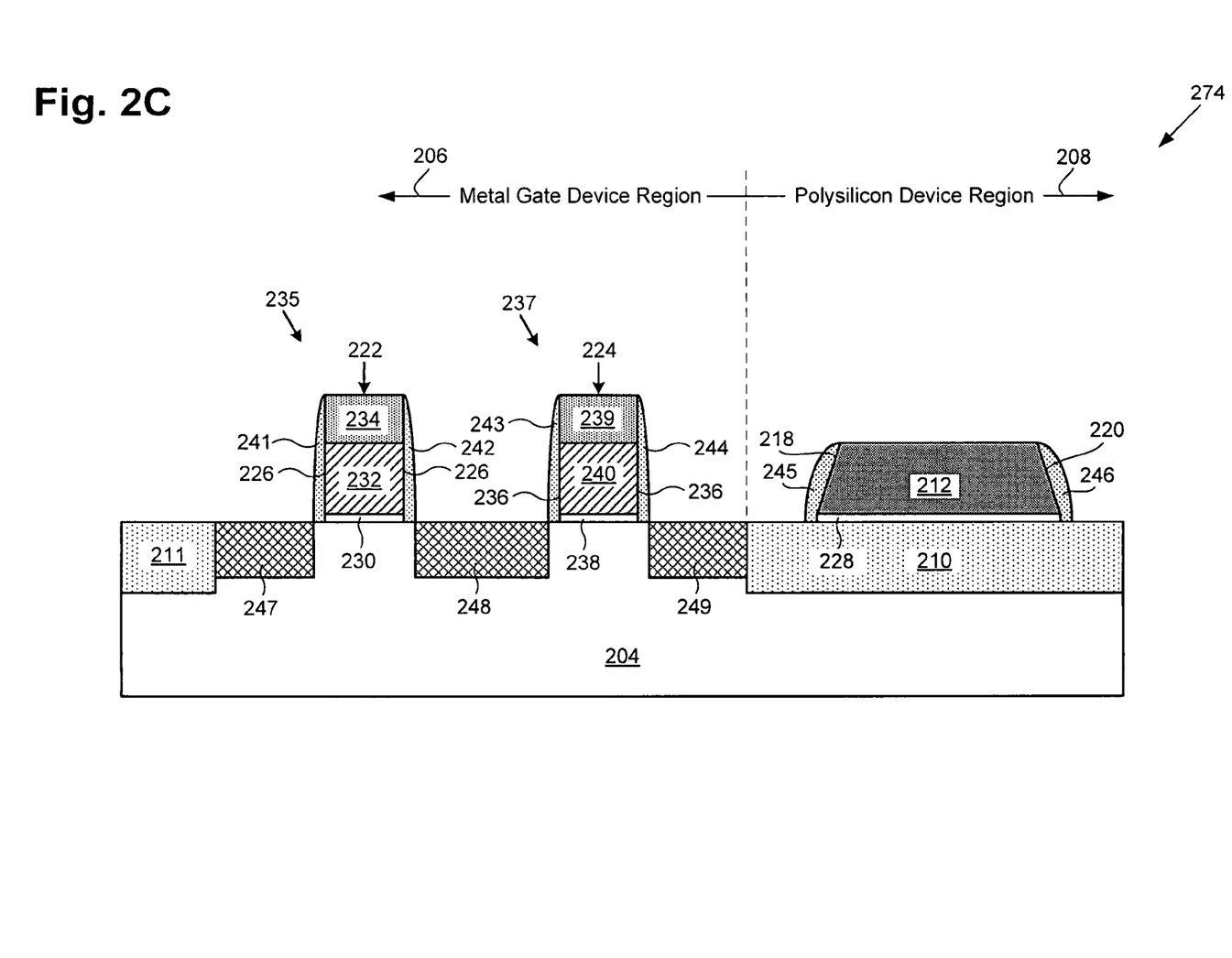
FIG. 2C illustrates a cross-sectional view, which includes a portion of a wafer processed according to an embodiment of the invention, corresponding to an intermediate step in the flowchart in FIG. 1.

Referring to step 174 in FIG. 1 and structure 274 in FIG. 2C, at step 174 of flowchart 100, inner spacers 241 and 242 are formed adjacent to gate stack 222, inner spacers 243 and 244 are formed adjacent to gate stack 224, inner spacers 245 and 246 are formed adjacent to polysilicon segment 212, and source/drain regions 247, 248, and 249 are formed in substrate 204. Inner spacers 241 and 242 are situated adjacent to sidewalls 226 of gate stack 222, inner spacers 243 and 244 are situated adjacent to sidewalls 236 of gate stack 224, and inner spacers 245 and 246 are situated adjacent to respective sidewalls 218 and 220 of polysilicon segment 212. Inner spacers 241, 242, 243, 244, 245, and 246 (hereinafter "inner spacers 241 through 246") can comprise, for example, silicon nitride, silicon dioxide, or other dielectric material.

Inner spacers 241 through 246 can be formed, for example, by depositing a layer of hard mask material, such as silicon nitride, over gate stacks 222 and 224 and polysilicon segment 212 and using an anisotropic RIE process to etch the hard mask material layer. Since the RIE process is anisotropic, the hard mask material remains on the sidewalls of gate stacks 222 and 224 and the sidewalls of polysilicon segment 212.

Source/drain region 247 is situated in substrate 204 adjacent to inner spacer 241 of gate stack 222, source/drain region 248 is situated in substrate 204 adjacent to inner spacers 242 and 243 of respective gate stacks 222 and 224, and source/drain region 249 is situated in substrate 204 adjacent to inner spacer 244 of gate stack 224. Thus, source/drain region 248 is shared by respective transistors 235 and 237, which include respective gate stacks 222 and 224. In an embodiment, source/drain regions 247, 248, and 249 can be formed, for example, by ion implantation. Thus, transistor 235 includes gate stack 222 and source/drain regions 247 and 248 and transistor 237 includes gate stack 224 and source/drain regions 248 and 249. Transistors 235 and 237 are metal gate transistors and can be, for example, NFETs. In one embodiment, transistors 235 and 237 can be PFETs. The result of step 174 of flowchart 100 is illustrated by structure 274 in FIG. 2C.

Figure 2D:
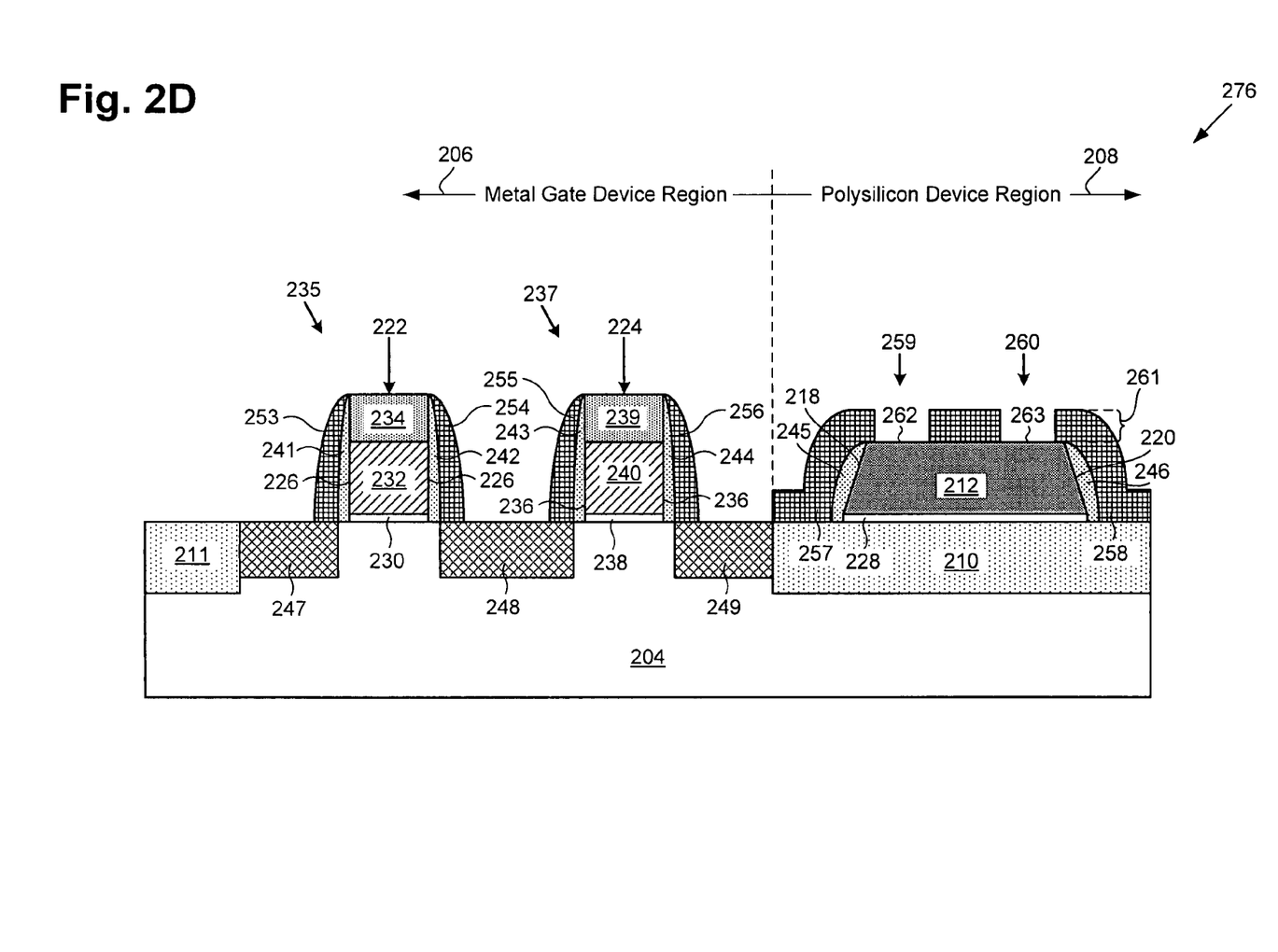
FIG. 2D illustrates a cross-sectional view, which includes a portion of a wafer processed according to an embodiment of the invention, corresponding to an intermediate step in the flowchart in FIG. 1.

Referring to step 176 in FIG. 1 and structure 276 in FIG. 2D, at step 176 of flowchart 100, outer spacers 253, 254, 255, 256, 257, and 258 (hereinafter "outer spacers 253 through 258") are formed on respective inner spacers 241 through 246. The dielectric material that is utilized to form the outer spacers remains over polysilicon device region 208, while it is removed over gate stacks 222 and 224 by utilizing, for example, resist mask anisotropic RIE. Openings 259 and 260 are formed in hard mask segment 261 to expose respective contact regions 262 and 263 of polysilicon segment 212. Outer spacers 253 and 254 are situated adjacent to respective inner spacers 241 and 242 of gate stack 222, outer spacers 255 and 256 are situated adjacent to respective inner spacers 243 and 244 of gate stack 224, and outer spacers 257 and 258 are situated adjacent to respective inner spacers 245 and 246 of polysilicon segment 212. Outer spacers 253 through 258 can comprise, for example, a dielectric material, such as silicon dioxide, situated adjacent to inner spacers 241 through 246 and another dielectric material, such as silicon nitride, situated adjacent to the silicon dioxide. Outer spacers 253 through 258 can have a thickness of, for example, between approximately 8.0 nm and approximately 30.0 nm in an embodiment of the invention.

Outer spacers 253 through 258 can be formed, for example, by first conformally depositing a layer of silicon dioxide over gate stacks 222 and 224, polysilicon segment 212 by using a PECVD process, an LPCVD process, or other suitable deposition process, and then conformally depositing a layer of silicon nitride over the layer of silicon dioxide by using a PECVD process, an PPCVD process, or other suitable deposition process. In one embodiment, the layer of silicon dioxide can have a thickness of, for example, between approximately 5.0 nm and approximately 20 nm. An etch-back process can be performed by using an anisotropic RIE process to etch the layers of silicon dioxide and silicon nitride, thereby forming outer spacers 253, 254, 255, and 256 in metal gate device region 206 while polysilicon device region 208 is protected by photoresist. As a result of the etch-back process, excess dielectric material from gate stacks 222 and 224 is removed while hard mask segment 261 comprising silicon nitride over silicon dioxide remains over polysilicon segment 212. Openings 259 and 260 can be formed, for example, by etching holes through hardmask segment 261 by using an RIE process or other etch process so as to expose respective contact regions 262 and 263 of polysilicon segment 212. The result of step 176 of flowchart 100 is illustrated by structure 276 in FIG. 2D.

Figure 2E:
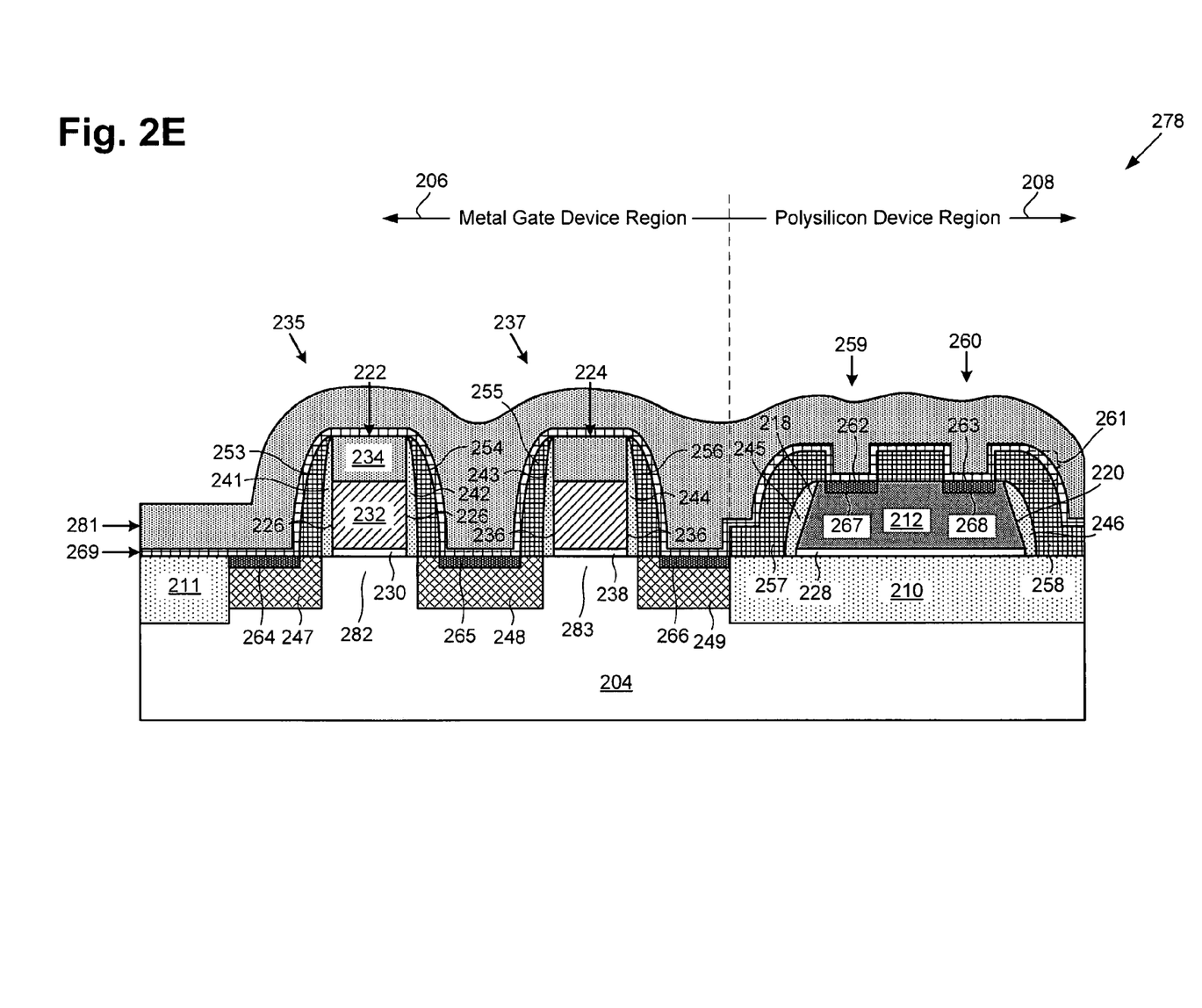
FIG. 2E illustrates a cross-sectional view, which includes a portion of a wafer processed according to an embodiment of the invention, corresponding to an intermediate step in the flowchart in FIG. 1.

Referring to step 178 in FIG. 1 and structure 278 in FIG. 2E, at step 178 of flowchart 100, silicide segments 264, 265, and 266, are formed in respective source/drain regions 247, 248, and 249, silicide segments 267 and 268 are formed in respective contact regions 262 and 263 of polysilicon segment 212, conformal etch stop layer 269 is formed over gate stacks 222 and 224, polysilicon segment 212, and substrate 204, and stress liner 281 is formed over conformal etch stop layer 269. Silicide segments 264, 265, and 266 are situated in respective source/drain regions 247, 248, and 249 and silicide segments 267 and 268 are situated in respective contact regions 262 and 263 of polysilicon segment 212. Silicide segments 264, 265, 266, 267, and 268 (hereinafter "silicide segments 264 through 268") can comprise, for example, cobalt silicide (CoSi), nickel silicide (NiSi), titanium silicide (TiSi), and the like. Silicide segments 264 through 268 can be formed in a salicide process (i.e. a self-aligned silicide process) by depositing a layer of metal over source/drain regions 247, 248, and 249 and contact regions 262 and 263 and then utilizing a thermal process to form the silicide segments, which only form over exposed silicon or polysilicon regions. Silicide segments 264 through 268 can have a thickness of, for example, between approximately 8.0 nm and approximately 30.0 nm.

Conformal etch stop layer 269 is situated over outer spacers 253 through 258, silicide segments 264 through 268, hard mask segment 261, isolation regions 210 and 211, and substrate 204. Conformal etch stop layer 269 can be a very thin dielectric etch stop layer and can comprise, for example, hafnium dioxide (HfO$_2$) or other suitable dielectric material. Conformal etch stop layer 269 can have a thickness of, for example, between approximately 10.0 Angstroms and approximately 30.0 Angstroms. Conformal etch stop layer 269 can be formed, for example, by conformally depositing a thin layer of hafnium oxide over outer spacers 253 through 258, silicide segments 264 through 268, hard mask segment 261, isolation regions 210 and 211, and substrate 204 by utilizing an ALD process, a CVD process, or other suitable deposition process.

In an embodiment of the invention, stress liner 281 can be a conformal dielectric layer and is situated over etch stop layer 269. Stress liner 281 can comprise silicon nitride, silicon carbon, boron nitride, or other suitable dielectric material for providing high tensile or compressive stress. Stress liner 281 can be formed over transistors 235 and 237 to provide either a tensile or a compressive stress in respective channel regions 282 and 283 so as to increase charge carrier mobility in the channel regions. For example, in an embodiment in which transistors 235 and 237 are NFETs, the process parameters of the deposition process utilized in the formation of stress liner 281 can be tuned such that it (i.e. stress liner 281) provides a tensile stress in channel regions 282 and 283 so as to increase electron mobility in the channel regions. For example, in an embodiment in which transistors 235 and 237 are PFETs, the process parameters of the deposition process utilized in the formation of stress liner 281 can be tuned such that it (i.e. stress liner 281) provides a compressive stress in channel regions 282 and 283 so as to increase hole mobility in the channel regions. Stress liner 281 can be formed by depositing a layer of dielectric material, such as silicon nitride, over etch stop layer 269 by using a PECVD process or other suitable deposition process. In an embodiment in which conformal etch stop layer 269 is utilized, stress liner 281 can be relatively thick. The result of step 178 of flowchart 100 is illustrated by structure 278 in FIG. 2E.

Figure 2F:
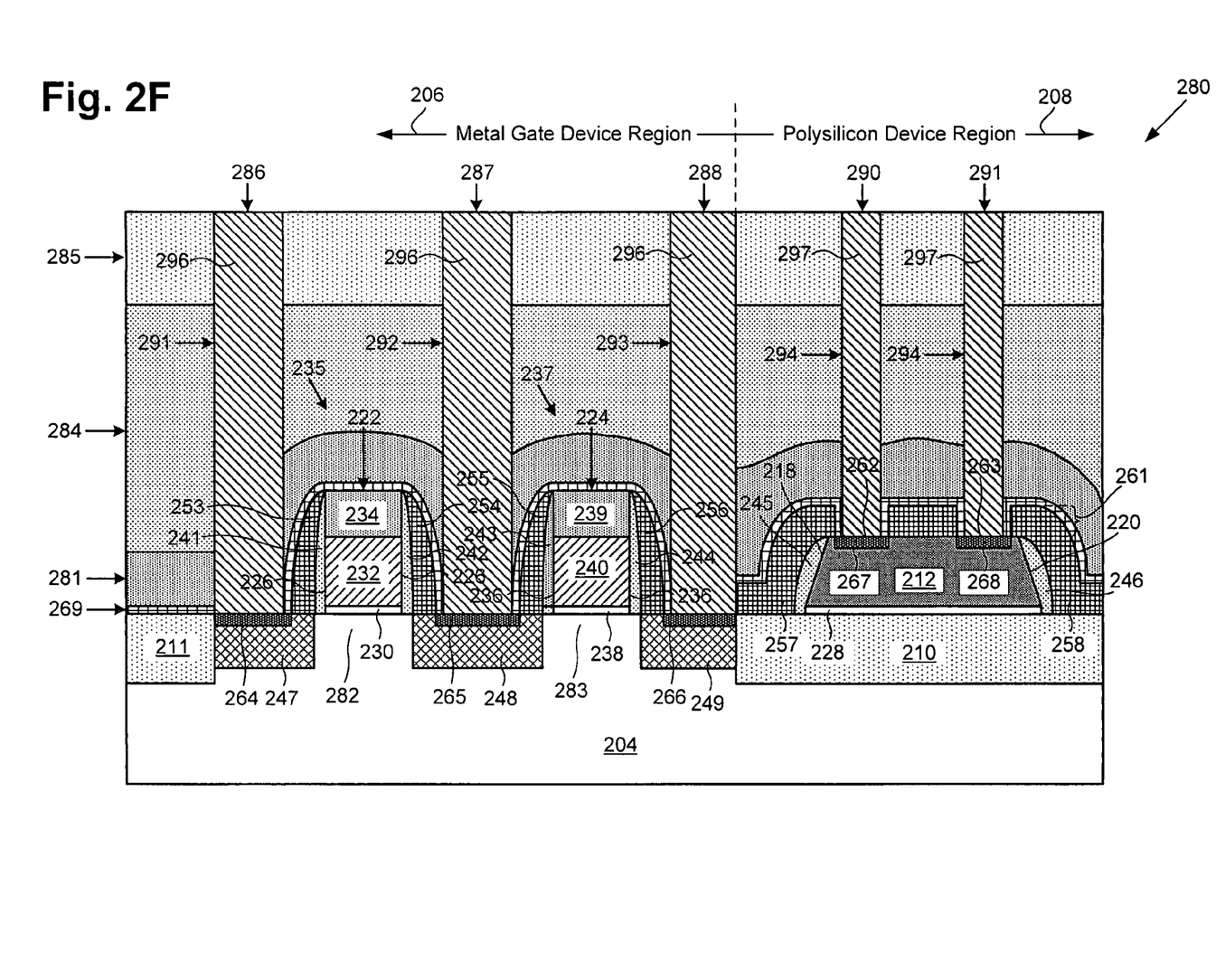
FIG. 2F illustrates a cross-sectional view, which includes a portion of a wafer processed according to an embodiment of the invention, corresponding to a final step in the flowchart in FIG. 1.

Referring to step 180 in FIG. 1 and structure 280 in FIG. 2F, at step 180 of flowchart 100, interlayer dielectric (ILD) 284 is formed over stress liner 281, sacrificial planarizing layer 285 is formed over ILD 284, source/drain contacts 286, 287, and 288 are formed over respective source/drain regions 247, 248, and 249, and polysilicon segment contacts 289 and 290 are formed over respective contact regions 262 and 263 of polysilicon segment 212. In structure 280, ILD 284 is situated over stress liner 281 and sacrificial planarizing layer 285 is situated over ILD 284. ILD 284 can comprise, for example, silicon dioxide, a low-k dielectric material, such as a low-k spin-on material, tetraethyl orthosilicate (TEOS), phosphosilicate glass (PSG), or borophosphosilicate glass (BPSG). ILD 284 can be formed, for example, by depositing a dielectric material, such as silicon dioxide, over stress liner 281 by utilizing a CVD process, a PECVD process, or other suitable deposition process. Sacrificial planarizing layer 285 can comprise, for example, a spin-on dielectric material, such as spin-on glass (SOG), which can be deposited over ILD 284 by utilizing a spin-on deposition process in an embodiment of the invention.

In structure 280, source/drain contacts 286, 287, and 288 are situated on respective silicide segments 264, 265, and 266 and polysilicon segment contacts 289 and 290 are situated on silicide segments 267 and 268, which are formed in polysilicon segment 212. Source/drain contacts 286, 287, and 288 include respective contact openings 291, 292, and 293 and metal filling 296 and polysilicon segment contacts 289 and 290 include respective contact openings 294 and 295 and metal filling 297. In an embodiment, each of source/drain contacts 286, 287, and 288 and polysilicon segment contacts 289 and 290 can also include an adhesion/barrier layer (not shown in FIG. 2F), which can be situated on the sidewalls of the contact openings.

Source/drain contacts 286, 287, and 288 can be formed by forming contact openings 291, 292, and 293, which extend through sacrificial planarizing layer 285, ILD 284, stress liner 281, and etch stop layer 269 and expose respective silicide segments 264, 265, and 266. As an example, contact opening 292 can be formed by depositing a layer of masking material, such as photoresist, over sacrificial planarizing layer 285 and patterning a contact hole in the masking material over source/drain region 248. The contact hole can be extended through sacrificial planarizing layer 285, ILD 284, and stress liner 281 to conformal etch stop layer 269 by utilizing an RIE process or other suitable etch process. The RIE process can be tuned to be selective to conformal etch stop layer 269, which can have a high selectivity to stress liner 281. As a result, the RIE process can be tuned to etch through stress liner 281 without significantly etching conformal etch stop layer 269.

Thus, the RIE process can etch through stress liner 281 and stop on conformal etch stop layer 269, thereby extending the contact hole to conformal etch stop layer 269. The RIE process can then be tuned to etch through conformal etch stop layer 269 in a break-through etch so as to expose silicide segment 265 and form contact opening 292. In the break-through etch, the RIE process can be timed so as to limit its duration, thereby preventing the RIE process from significantly etching into outer spacers 254 and 255 of respective transistors 235 and 237. By forming a very thin, conformal etch stop layer, the time required for the RIE process to etch through it (i.e. conformal etch stop layer 269) can be minimized. Contact openings 291 and 293 for respective source/drain regions 247 and 249 and contact openings 294 and 295 for respective contact regions 262 and 263 of polysilicon segment 212 can be formed in a substantially similar manner as contact opening 292.

After contact opening 292 has been formed, an adhesion/barrier layer (not shown in FIG. 2F) can be deposited on the sidewalls of the contact opening and metal filling 296 can be deposited in the contact opening to form source/drain contact 287. Metal filling 296 can comprise tungsten or other metal and can be formed by utilizing a PVD process or other suitable deposition process. Source/drain contacts 286 and 288 and polysilicon segment contacts 289 and 290 can be formed in a substantially similar manner as source/drain contact 292.

By utilizing conformal etch stop layer 269 to prevent the etch process, such as an RIE process, from significantly etching into outer spacers 254 or 255 as well as hard mask segments 234 and 239 in case of contact mask to gate pattern mis-alignment, contact opening 292 and, consequently, source/drain contact 287, can be self-aligned to metal gate 232 and metal gate 240. Similarly, source/drain contacts 286 and 288 can be self-aligned to respective metal gates 232 and 242. Thus, conformal etch stop layer 269 imposes a predetermined distance between source/drain contact and adjacent metal gate, and thereby causes the source/drain contact to be self-aligned to the metal gate. Thus, in an embodiment of the invention, a thin, conformal etch stop layer can be utilized to provide self-aligned source/drain contacts for metal gate transistors. Also, in an embodiment of the invention, metal gate transistors, such as metal gate transistors 235 and 237, in a metal gate device region of a substrate can be effectively integrated with a polysilicon device, such as a polysilicon resistor (e.g. polysilicon segment 212), in a polysilicon device region of the substrate. An embodiment of the invention's metal gate transistors with self-aligned source/drain contacts can be advantageously utilized in logic circuits, such as high performance logic circuits.

In one embodiment of the invention, a thin, conformal stress liner can be utilized in place of conformal etch stop layer 269 and stress liner 281 to provide source/drain contacts, such as source/drain contacts 291, 292, and 293, that are self-aligned to adjacent metal gates, such as metal gates 232 and 242. The thin, conformal stress liner can comprise a similar dielectric material as stress liner 281, such as silicon nitride. The thin, conformal stress liner can be conformally deposited over outer spacers 253 through 258, silicide segments 264 through 268, hard mask segment 261, isolation regions 210 and 211, and substrate 204 by utilizing a PECVD process or other suitable deposition process. The deposition process utilized to deposit the thin, conformal stress liner can be tuned in a similar manner as discussed above to provide the appropriate stress (e.g. a tensile stress for an NFET or a compressive stress for a PFET) in the channel regions of the transistors.

The conformal stress liner can be sufficiently thin to allow a space to form between portions of the conformal stress liner that are situated on adjacent outer spacers of adjacent transistors, such as outer spacers 254 and 255 of respective adjacent transistors 235 and 237. This space can determine the width of a source/drain contact subsequently formed over a shared source/drain region, such as source/drain region 248. The thin, conformal stress liner can have a thickness of, for example, between approximately 10.0 nm and approximately 25 nm. During formation of a contact opening, such as contact opening 292, an etch process, such as an RIE process, can be utilized to etch a contact hole through sacrificial planarizing layer 285 and ILD 284 and to stop on an exposed portion of the thin, conformal stress liner situated over a silicide segment, such as silicide segment 265. For example, an RIE process can be tuned to be selective to the thin, conformal stress liner, which can have a high selectivity to ILD 284.

After the RIE process etches through ILD 284, the contact opening can be formed by tuning the RIE process to etch through (i.e. break through) the thin, conformal stress liner to expose the underlying silicide segment formed in a source/drain region. In the break-through etch, the RIE process can be timed such that the RIE process etches through the thin, conformal stress liner overlying the source/drain region without significantly etching into adjacent outer spacers, such as outer spacers 254 and 255. By utilizing the thin, conformal stress liner to prevent the etch process, such as an RIE process, from significantly etching into outer spacers 254 or 255, contact opening 292 and, consequently, source/drain contact 287, can be self-aligned to metal gate 232 and metal gate 240. Similarly, source/drain contacts 286 and 288 can be self-aligned to respective metal gates 232 and 242. Thus, in one embodiment of the invention, a thin, conformal stress liner can be utilized to provide self-aligned source/drain contacts for metal gate transistors by imposing a pre-determined distance between source/drain contact and adjacent metal gate.

Thus, as discussed above, in an embodiment of the present invention, a thin, conformal etch stop layer can be advantageously utilized to provide self-aligned source/drain contacts for metal gate transistors. In one embodiment of the present invention, a thin, conformal stress liner can be advantageously utilized to provide self-aligned source/drain contacts for metal gate transistors. The invention's metal gate transistors with self-aligned source/drain contacts can be advantageously utilized in logic circuits, such as high performance logic circuits. By forming self-aligned source/drain contacts, the present invention advantageously avoids the formation of gate-to-source/drain contact shorts, which can occur in a conventional process flow that utilizes contact and gate masks to align source/drain contacts.

An embodiment of the present invention also provides a method for advantageously integrating metal gate transistors on a common substrate with polysilicon devices, such as polysilicon resistors and fuses, without requiring multiple additional masking steps.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

The invention claimed is:

1. A method for forming at least a first metal gate transistor and a second metal gate transistor with a self-aligned source/drain contact, said method comprising:

forming a first metal gate and a second metal gate over a substrate;

forming inner spacers adjacent each of said first metal gate and said second metal gate;

forming a source/drain region in said substrate adjacent to said inner spacers, said source/drain region not situated directly beneath said inner spacers;

forming outer spacers adjacent said inner spacers, said outer spacers situated directly on and making contact with said source/drain region;

forming a conformal etch stop layer over said first metal gate, said second metal gate, and said source/drain region;

forming a source/drain contact over said source/drain region and between portions of said conformal etch stop layer over said outer spacers, said source/drain contact having a generally uniform width determined by the space between said portions;

wherein said conformal etch stop layer imposes a pre-determined distance between said source/drain contact and each of said first metal gate and said second metal gate, thereby causing said source/drain contact to be self-aligned to said first metal gate and said second metal gate;

said first metal gate transistor and said second metal gate transistor being integrated with a polysilicon device situated over said substrate, said polysilicon device including a polysilicon segment having sloped sidewalls.

2. The method of claim 1 further comprising forming a silicide segment in said source/drain region prior to forming said conformal etch stop layer.

3. The method of claim 1 further comprising forming a stress liner over said conformal etch stop layer.

4. The method of claim 3, wherein forming said source/drain contact over said source/drain region comprises utilizing an etch process that is selective to said conformal etch stop layer to etch through said stress liner.

5. The method of claim 1, wherein forming said source/drain contact over said source/drain region comprises utilizing a timed reactive ion etch process to break through said conformal etch stop layer.

6. The method of claim 1, wherein said conformal etch stop layer comprises hafnium dioxide.

7. The method of claim 1, wherein said conformal etch stop layer has a thickness of between approximately 10.0 Angstroms and approximately 30.0 Angstroms.

8. A structure including at least a polysilicon device, and a first metal gate transistor and a second metal gate transistor with a self-aligned source/drain contact, said structure comprising:

a first metal gate and a second metal gate situated over a substrate;

inner spacers adjacent said first metal gate and said second metal gate;

a source/drain region situated in said substrate adjacent to said inner spacers, said source/drain region not situated directly beneath said inner spacers;

outer spacers adjacent said inner spacers, said outer spacers situated directly on and making contact with said source/drain region;

a conformal etch stop layer situated over said first metal gate, said second metal gate, and said source/drain region;

a source/drain contact situated over said source/drain region and adjacent portions of said conformal etch stop layer over said outer spacers, said source/drain contact having a generally uniform width determined by the space between said portions;

wherein said conformal etch stop layer imposes a predetermined distance between said source/drain contact and each of said first metal gate and said second metal gate, thereby causing said source/drain contact to be self-aligned to said first metal gate and said second metal gate;

said first metal gate transistor and said second metal gate transistor being integrated with said polysilicon device, said polysilicon device including a polysilicon segment having sloped sidewalls.

9. The structure of claim 8 further comprising a silicide segment situated between said conformal etch stop layer and said source/drain region.

10. The structure of claim 8 further comprising a stress liner situated over said first metal gate, said second metal gate, said source/drain region and said conformal etch stop layer.

11. The structure of claim 10 wherein said outer spacers are situated between said inner spacers and said stress liner.

12. The structure of claim 8, wherein said conformal etch stop layer comprises hafnium dioxide.

13. The structure of claim 8, wherein said conformal etch stop layer has a thickness of between approximately 10.0 Angstroms and approximately 30.0 Angstroms.

14. The structure of claim 8, wherein said polysilicon device comprises a resistor.

15. The structure of claim 8, wherein said polysilicon device comprises a fuse.

16. The structure of claim 8, wherein integration of said first metal gate transistor, said second metal gate transistor, and said polysilicon device comprises:
   forming said polysilicon segment in a polysilicon device region of said substrate;
   forming a metal layer in a metal gate device region of said substrate and in said polysilicon device region;
   forming a hard mask over said metal layer; and
   patterning said hard mask and said metal layer to form a first gate stack and a second gate stack, said first gate stack including said first metal gate of said first metal gate transistor and said second gate stack including said second metal gate of said second metal gate transistor.

17. The structure of claim 16, wherein patterning said hard mask and said metal layer includes removing said metal layer from said polysilicon segment.

18. The structure of claim 16, wherein said integration further comprises removing said metal layer from said polysilicon segment prior to forming said hard mask over said metal layer.

19. The structure of claim 16, wherein said integration further comprises forming a gate dielectric layer in said metal gate and polysilicon device regions prior to forming said polysilicon segment.

* * * * *